United States Patent [19]

Nall

[11] 4,318,008
[45] Mar. 2, 1982

[54] RANDOM POWER CONTROLLER

[75] Inventor: Joseph E. Nall, Tyler, Tex.

[73] Assignee: J. N. Engineering, Inc., Tyler, Tex.

[21] Appl. No.: 182,780

[22] Filed: Aug. 29, 1980

[51] Int. Cl.³ .............................................. H03K 3/84
[52] U.S. Cl. ....................................... 307/84; 331/47; 331/78
[58] Field of Search ......................... 307/84, 525, 526; 331/47, 78; 364/717

[56] References Cited

U.S. PATENT DOCUMENTS 3,575,606 4/1971 Bledsoe ............................. 331/78 X Primary Examiner—Michael L. Gellner
Assistant Examiner—James L. Dwyer
Attorney, Agent, or Firm—Hubbard, Thurman, Turner, Tucker & Glaser

[57] ABSTRACT

The frequency of a reference oscillator is controlled by a reference voltage which is altered at the beginning of an output cycle to equal the instantaneous value of the averaged outputs of a first oscillator and a second oscillator. In a preferred embodiment, the outputs from the reference oscillator and the second oscillator are summed, and this voltage is used to control the power output to a load.

14 Claims, 3 Drawing Figures

RANDOM POWER CONTROLLER

BACKGROUND OF THE INVENTION

1. Field of the Invention

The present invention relates to electronic devices which can produce a randomly variable output voltage or frequency, and devices which can deliver power to a load at a rate proportional to a randomly generated voltage level.

2. Description of the Prior Art

It is often desirable to randomly vary the power output to a load. The load can be, for example, Christmas tree lights, advertising display lighting, or a device providing a mechanical output proportional to a voltage input. The power output to the load may be controlled by a mechanical switch such as in Christmas tree lights, which randomly opens and closes due to thermal expansion and contraction of its parts. Or the power to the load can be turned on at the receipt of a random input voltage pulse.

One method of generating random pulses is to sample the output voltage of a relatively high frequency oscillator at irregular intervals, and use the sampled value to determine the time delay until the next pulse. The irregular sampling interval is determined from the previous time delay. This type of system has a drawback in that there is a tendency for the pulses to settle into a regular rhythm. This is due to the fact that the waveform which is sampled to determine the next time delay is regular. If in the course of operation the variable time delay becomes an integral multiple of the period of the sampled waveform, the waveform is sampled at the identical point each time and the output voltage is no longer random.

This type of circuit has the further drawback that if the output voltage were to be used to control the power output to a load, the load would be abruptly switched on and off. In many applications, this effect is undesirable.

SUMMARY OF THE INVENTION

An object of the present invention is to provide a random, smoothly varying power output to a load. In accordance with an aspect of the invention, the output voltages of a first oscillator and a second oscillator, having different fixed frequencies, are averaged by an averaging circuit. The first and second oscillator outputs may be any desired waveform. In a preferred embodiment, the first oscillator generates a sawtooth wave, and the second oscillator generates a triangular wave. The output of the averaging circuit is sampled, and the sampled voltage controls the output level of a voltage reference circuit. The output voltage of the voltage reference circuit controls the oscillation frequency of a voltage controlled oscillator. The voltage controlled oscillator provides an output signal and a gating signal. The voltage controlled output signal can be of any form, and in a preferred embodiment it is a triangular wave. The gating signal is provided to the gate so that the averaging circuit output is sampled at the end of an output cycle of the voltage controlled oscillator. In the preferred embodiment, the gating signal is provided at the end of every output cycle of the voltage controlled oscillator.

The voltage controlled output frequency changes at the end of each cycle to reflect the updated sampled averaging circuit output. The averaging circuit output is irregular and is sampled at irregular intervals, causing the output frequency of the voltage controlled oscillator to vary randomly. The outputs from the second oscillator and the voltage controlled oscillator are added in a summer, giving a continuous, randomly varying output. The summer output is coupled to a power control circuit, which varies the power delivered to a load in proportion to the value of the summer output voltage.

A modification is to sum together the outputs of more than two oscillators. The inclusion of additional oscillators, which can be fixed or variable output frequency, makes the summed output voltage waveform more complex.

Another modification is to use the output of a fixed frequency oscillator to provide the gating signal. This causes the output frequency of the voltage controlled oscillator to vary at fixed intervals instead of at the end of an output cycle.

A further object of the present invention is to provide a randomly varying, continuous voltage source. According to an aspect to the present invention, this is accomplished by disconnecting the power output control from the output of the summer. This output voltage may be used wherever a randomly varying voltage level is desired.

Another object of the present invention is to provide a randomly varying frequency source which can be used, for example, to impair a communications channel. In an aspect of the invention, the output of the above described voltage controlled oscillator may be disconnected from the summer, and used as the frequency source. The output frequency of the voltage controlled oscillator varies at the end of each output cycle in a random fashion. This randomly varying signal will effectively block a communications channel.

The novel features which characterize the invention are defined by the appended claims. The foregoing and other objects and advantages of the invention will hereinafter appear, and for purposes of illustration, but not of limitation, an exemplary embodiment is shown in the drawings.

DETAILED DESCRIPTION OF THE DRAWINGS

Figure 1:
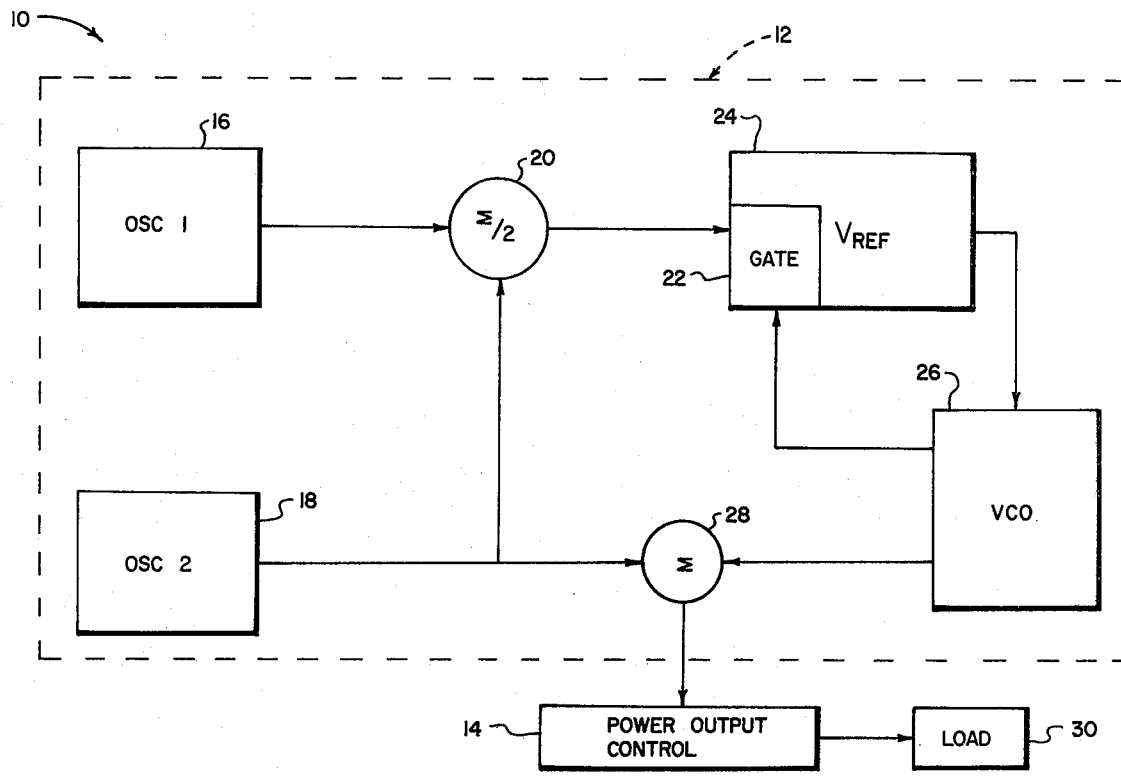
FIG. 1 is a functional block diagram of a random power controller.

Referring to FIG. 1, a random power controller 10 comprises generally a random voltage source 12 and a power output control 14. A first oscillator 16 and a second oscillator 18 operate at different frequencies, with neither frequency being an integral multiple of the other. The outputs from the first oscillator 16 and the second oscillator 18 are averaged by an averaging circuit 20. The output of the averaging circuit 20 is the arithmetic mean of the instantaneous values of the outputs from the first oscillator 16 and the second oscillator 18.

The output from the averaging circuit 20 is connected to a gate 22 of a reference voltage circuit 24. The output of the reference voltage circuit 24 is connected to a voltage controlled oscillator 26. The frequency of the voltage controlled oscillator 26 is variable, and is proportional to the output of the reference voltage circuit 24. The voltage controlled oscillator 26 controls the gate 22. The gate 22 samples the output from the averager 20 when an appropriate signal from the voltage controlled oscillator 26 is received. The output from the second oscillator 18 and the voltage controlled oscillator 26 are added together in the summer 28. The output from the summer 28 is connected to the power output control 14. The power output control 14 controls the power delivered to a load 30.

The general operation of the variable power controller 10 is now described. The output waveforms of the first oscillator 16, the second oscillator 18, and the voltage controlled oscillator 26 may be of any desired shape. In the preferred embodiment, the output from the first oscillator 16 is a sawtooth wave, and the outputs from the second oscillator 18 and the voltage controlled oscillator 26 are triangular waves. The output frequencies of the first oscillator 16 and the second oscillator 18 are different, and neither is an integral multiple of the other. In the preferred embodiment, the output of the first oscillator 16 is of a higher frequency than the output of the second oscillator 18. The outputs of the oscillators 16, 18 are averaged in the averaging circuit 20. The output of the averaging circuit 20 is a highly irregular waveform.

The voltage controlled oscillator 26 sends a gating signal to the gate 22 at the end of each output cycle. Upon receipt of the gating signal, the gate 22 samples the instantaneous output of the averager 20, and this value is stored in the reference voltage circuit 24. The reference voltage circuit 24 provides a DC output which controls the output frequency of the voltage controlled oscillator 26. Since the gate 22 is opened at the end of each output cycle of the voltage controlled oscillator 26, the output voltage of the reference voltage circuit 24 also changes at that time. The net result is that the frequency of the voltage controlled oscillator 26 changes at the end of every output cycle.

The output frequency of the voltage controlled oscillator 26 varies in a random fashion. This is a result of the irregular output from the averager 20, and the non-periodic sampling of this output by the gate 22. This randomly varying frequency can be used wherever unpredictable frequencies over a specified range are desired, such as jamming of a radio communications channel, by using the output of the voltage controlled oscillator 26 directly.

To generate an irregular voltage source, the outputs from the second oscillator 18 and the voltage controlled oscillator 26 are summed together in the summer 28. Since the frequency of the voltage controlled oscillator 26 varies with time, the output of the summer 28 is a continuous, irregular, pseudo-random waveform. The output from the summer 28 is connected to the power output control 14. The power delivered to the load 30 is proportional to the output voltage of the summer 28, so that the power delivered to the load 30 varies irregularly with time.

The random voltage source 12 may be used apart from the power output control 14. The output of the summer 28 can be used directly wherever a continuous, irregular voltage source is needed.

Figure 2:
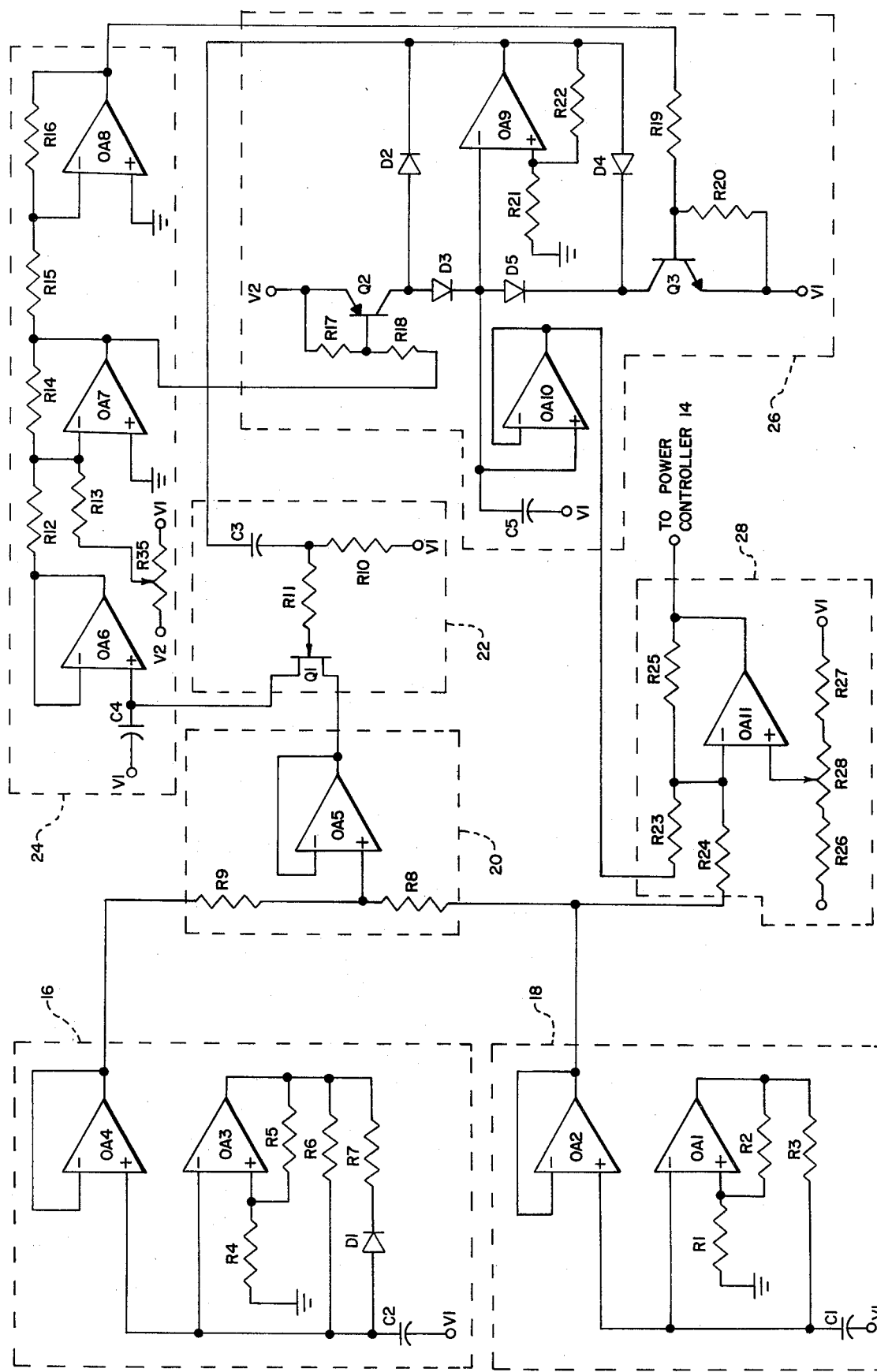
FIG. 2 is a schematic diagram of an apparatus for providing a randomly varying voltage output.

Referring to FIG. 2, a schematic diagram of the preferred embodiment of the present invention is shown. The voltage sources V1 and V2 are terminals of a split voltage power supply (not shown), with V1 being the negative supply terminal and V2 having the same magnitude as V1, and being the positive supply terminal. The operational amplifiers, OA1–OA11, can be any standard operational amplifier, with a high open loop gain, high input impedance at both input terminals, and low output impedance. The operational amplifiers preferably operate off of the split power supply V1 and V2.

The second oscillator 18 comprises generally OA1 and OA2. This is not a true triangular wave oscillator, but closely approximates a triangular wave by the exponential charging and discharging of capacitor C1. OA1 operates as a differential amplifier with a high gain. Therefore, the output of OA1 switches between the positive and negative values of the power supply voltage. The voltage divider defined by resistors R1 and R2 fixes the voltage at the positive input to OA1 relative to the output of OA1. The output from OA1 charges capacitor C1 at a rate determined by the value of capacitor C1 and resistor R3. C1 is connected to the negative input of OA1, so that the voltage occurring across C1 becomes the negative input to the differential amplifier OA1. When the magnitude of the voltage across C1 becomes greater than the fixed voltage at the positive input of OA1, the output of OA1 switches abruptly to the negative power supply voltage. The voltage at the positive input of OA1 is now a fixed negative value defined by R1 and R2. C1 begins discharging through the output of OA1, the rate again being determined by the values of C1 and R3. When the voltage across C1 becomes more negative than the voltage at the positive input to OA1, the differential amplifier OA1 registers a positive difference, and the output of OA1 abruptly switches back to the positive power supply voltage. The voltage across C1 is an exponential charging and discharging voltage, and approximates a triangular wave. The portion of the exponential used, and thus the quality of the triangular wave, is determined by the ratio of resistors R2 and R1. R1 and R2 are preferably chosen so that the voltage across C1 varies from $\frac{1}{3}$(V1) to $\frac{1}{3}$(V2). OA2 is connected as a voltage follower to the capacitor C1 so that the second oscillator 18 is not affected by the remainder of the circuit.

The first oscillator 16 comprises generally OA3 and OA4. R4, R5, and R6 function identically to R1, R2 and R3 as discussed previously. So do OA3 and C2 parallel the operation of OA1 and C1. When C2 is being charged by a positive voltage at the output of OA3, the series combination of D1 and R7 has no effect on the circuit because D1 is reverse baised. When C2 is discharging through the output of OA3, D1 becomes forward biased and R7 is in parallel with R6 in the discharge path. R7 is much smaller than R6, so that the time of discharge is determined by the magnitude of R7. Since R7 is much smaller than R6, the time for discharge of C2 is much shorter than that for charging it initially. Therefore the voltage on C2 approximates a sawtooth wave. OA4 is also connected as a voltage follower, and isolates the first oscillator 16 from the effects of the rest of the circuit.

The averaging circuit 20 comprises generally OA5. The outputs of OA2 and OA4 are connected to the positive input of OA5 through R8 and R9. The voltage at the positive input to OA5 is proportional to the sum of the outputs of OA2 and OA4. In the preferred embodiment, the resistance of R8 and R9 is the same, so the voltage at the positive input to OA5 is the average of the voltages at the outputs of OA2 and OA4. Since the values for R1, R2, R4, and R5 were chosen so that the output voltages of the oscillators 16 and 18 were always between ⅓(V1) and ⅓(V2), the output of OA5 varies between these values. OA5 is also connected in a voltage follower arrangement, so that the output of OA5 is equal to the voltage at the positive input.

The gate 22 comprises generally Q1. When the voltage at the gate of field effect transistor Q1 is positive, Q1 turns on. A differentiator is defined by C3 and R10. When a positive going portion of a square wave is impressed across the combination of C3 and R10, a positive pulse is generated across R10. Essentially no voltage appears across R11, therefore Q1 turns on from this positive pulse. C3 and R10 are chosen so that the pulses input to Q1 are narrow, which causes Q1 to be on for only very short periods of time. Thus the gate 22 samples the output voltage of OA5 when a positive going signal is received by the gate 22.

In the reference voltage circuit 24, capacitor C4 holds the sampled output from OA5. When Q1 is off, C4 has no discharge path, and therefore the voltage across it is constant. When Q1 is on, the voltage across C4 becomes equal to the output voltage of OA5 either by charging to a higher voltage if the output of OA5 is greater than the voltage across C4, or discharging through the output of OA5 if the previous voltage across C4 is greater. OA6 is connected in a voltage follower arrangement so that the output of OA6 is equal to the voltage stored by capacitor C4. The output of OA6 is summed together with a bias voltage taken from potentiometer R35, through the inverting summer defined by R12, R13, R14 and OA7. The output from OA7 is connected to the input of the inverting summer defined by R15, R16 and OA8. R15 and R16 have equal resistance, so that the output of OA8 always has the same magnitude and opposite sign as the output of OA7. The outputs of OA7 and OA8 are the reference voltage which controls the output frequency of the voltage controlled oscillator 26.

The voltage controlled oscillator 26 operates on the same general principles as the first and second oscillators 16, 18. The output of OA9 abruptly switches from the positive to the negative power supply voltage, and capacitor C5 is charged and discharged to provide an approximation to a triangular wave. In the voltage controlled oscillator 26, the rate of charge and discharge of C5 is controlled by the current flow through Q2 and Q3. When the output voltage of OA7 is negative and OA8 is positive, Q2 and Q3 conduct more current, thereby charging and discharging C5 more quickly. When the output of OA7 is positive and OA8 is negative, Q2 and Q3 charge and discharge C5 more slowly. The rate at which C5 charges and discharges determines the output frequency of the voltage controlled oscillator 26, making the output frequency proportional to the reference voltages at the outputs of OA7 and OA8.

Selection of resistor R14 sets the difference between the maximum values for the reference voltages. Adjustment of R35 changes the bias input to OA7, which sets the values of the maximum and minimum reference voltage. Variation of these parameters changes the range of frequencies at which the voltage controlled oscillator 26 will oscillate.

R17 and R18 bias transistor Q2 while R19 and R20 bias transistor Q3. R21 and R22 function in the same manner as R1 and R2 of the second oscillator 18. The diodes D2, D3, D4 and D5 assure that current always flows in the proper direction from transistors Q2 and Q3.

The output of OA9 is a square wave changing between the values of the positive and negative power supply voltages. This square wave is fed back into the gate 22, which is activated as previously described. Thus, each time the output of OA9 switches from negative to positive, the gate 22 samples the output of OA5, and a new reference voltage is determined. Since capacitor C5 charges when the output of OA9 is positive and discharges when the output of OA9 is negative, the reference voltage changes at the negative peaks of the triangular wave output across C5. This means that the frequency of the voltage controlled oscillator 26 changes once every cycle of the output voltage across C5, and this always happens at the negative peak.

OA10 is connected as a voltage follower to isolate the voltage controlled oscillator 26 from the effects of the rest of the circuit. The output from OA10 can be used directly wherein a randomly varying frequency is needed.

The outputs of OA2 and OA10, which are both triangular waves, are connected to the inputs of the inverting summer 28, defined by R23, R24, R25 and OA11. R26 and R27 are of approximately the same value, and R28 is a potentiometer. The effect of varying R28 is to introduce a variable DC voltage signal into the positive input of OA11. This provides a variable DC offset voltage in the output of OA11. This DC offset arrangement is not necessary to the operation of the circuit, but provides a variation in intensity of power to the load 30 when connected with the power output control 14.

The output of OA11 may be used to drive the power output control 14, or wherever an irregular voltage source is needed.

Figure 3:
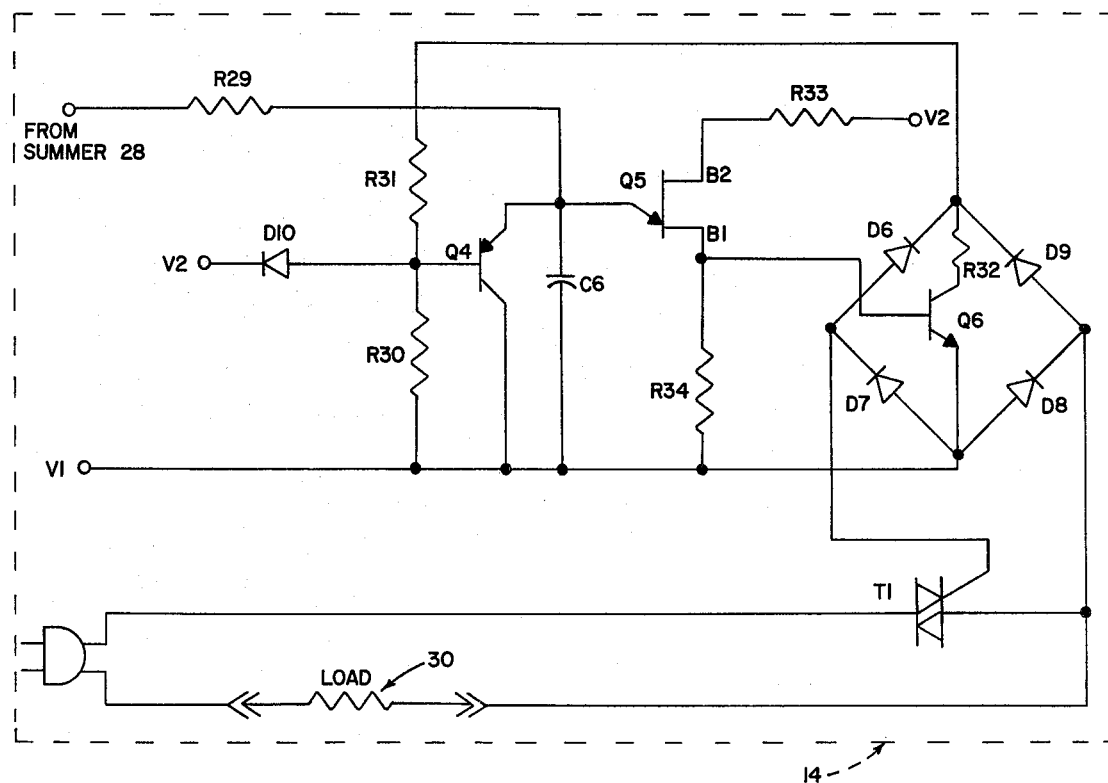
FIG. 3 is a schematic diagram of a power output control.

Referring to FIG. 3, a preferred embodiment of the power output control 14 is shown. The power output control 14 is coupled to the output of the summer 28 of FIG. 2 through resistor R29. Capacitor C6 is charged at a rate proportional to the output voltage of OA11.

Resistors R33 and R34 establish the negative resistance region of unijunction transistor Q5. The value of R29 is chosen so that the unijunction transistor Q5 is biased in the negative resistance region. Q5 turns on when the voltage across capacitor C6 reaches the turn on voltage. When Q5 conducts, current flows into the base of Q6. Q6 is a high voltage transistor to protect the low voltage electronics and to turn on Triac T1. Triac T1 is turned on when Q6 is turned on. The triac T1 is in series with the load power supply which is preferably 120 volts, 60 Hz. T1 remains on from the time it is first turned on until the next zero crossing of the load power supply.

It is necessary to discharge capacitor C6 at each zero crossing of the high voltage power supply in order to properly time the turn on of T1. Capacitor C6 is discharged whenever transistor Q4 is turned on. The diode bridge made up of diodes D6, D7, D8 and D9 causes the leading portions of a full wave rectified voltage to appear across resistors R30 and R31. This voltage is small when Triac T1 is on. The peak magnitude of the voltage across R30 is clipped at approximately the value of V2 by diode D10. When the voltage across resistor R30 becomes small, the voltage at the base of Q4 becomes approximately the value of V1. At this point, transistor Q4 turns on and discharges capacitor C6. The voltage at the base of Q4 approaches V1 at each zero crossing of the load power supply.

At each zero crossing of the load power supply, C6 is discharged and T1 turns off. T1 will remain off until the voltage across C6 becomes large enough to turn Q5 on. The rate of increase for the voltage across C6 is proportional to the output of the summer 28, making the time that T1 is on for each cycle of the load power supply proportional to the output of the summer 28. The power delivered to the load 30 is proportional to the time that T1 is on.

Although a preferred embodiment has been described in detail, it will be appreciated that various substitutions, alterations and additions may become apparent to those skilled in the art. These modifications may be made without departing from the scope and spirit of the invention as defined by the appended claims.

What is claimed is:

1. An apparatus for providing a randomly varying voltage, which comprises:
    a first oscillator having a periodic output;
    a second oscillator having a periodic output;
    an averager having an output proportional to the sum of the first periodic output and the second periodic output;
    a sample and hold unit which provides a reference voltage proportional to a sampled value of the output of said averager;
    a third oscillator having a periodic output, wherein the frequency is controlled by the reference voltage, and which also supplies a sampling signal to said sample and hold unit wherein the averager output is sampled when the sample and hold unit receives the sampling signal; and,
    a summer which adds the output voltages of said second oscillator and said third oscillator.

2. The apparatus of claim 1 wherein:
    the output of said second oscillator is a triangular wave; and
    the output of said third oscillator is a triangular wave.

3. The apparatus of claim 1 wherein the output of said first oscillator is a sawtooth wave.

4. The apparatus of claim 1 wherein the output of said averager is the arithmetic mean of the first periodic output and the second periodic output.

5. An apparatus for providing a randomly varying voltage, which comprises:
    a first oscillator having a sawtooth wave output;
    a second oscillator having a triangular wave output, wherein the first oscillator output is of a higher frequency than the second oscillator output, and the first oscillator output frequency is a nonintegral multiple of the second oscillator output frequency;
    an averager having an instantaneous output which is the average of the instantaneous values of the first oscillator output and the second oscillator output;
    a variable frequency oscillator having a triangular wave output and a gating signal output;
    a sampling gate, wherein the first summer output is sampled when the gating signal is received by said sampling gate;
    a reference voltage circuit having a constant output between the receipt of gating signals by said sampling gate, which is proportional to the sampled value of the averager output, and which controls the variable frequency oscillator output frequency of the triangular wave and the gating signal; and,
    a summer having an output proportional to the sum of the second oscillator output and the variable frequency oscillator output.

6. An apparatus for providing a randomly varying power to a load, which comprises:
    a first oscillator having a periodic output;
    a second oscillator having a periodic output;
    an averager having an output proportional to the sum of the first periodic output and the second periodic output;
    a sample and hold unit which provides a reference voltage proportional to a sampled value of the output of said averager;
    a third oscillator having a periodic output, wherein the frequency of the third periodic output is controlled by the reference voltage, and which supplies a sampling signal to said sample and hold unit, wherein the averager output is sampled when the sample and hold unit receives the sampling signal;
    a summer which adds the output voltages of said second oscillator and said third oscillator;
    a circuit for providing power to a load; and,
    means coupled to said summer for controlling said output circuit, such that power transmitted to the load is proportional to the output voltage of said summer.

7. The apparatus of claim 6 wherein said control means comprises:
    means for charging a capacitor at a rate proportional to the output voltage of said summer; and
    means for delivering power to the load during a portion of the power supply voltage cycle proportional to the charge on the capacitor.

8. A method of producing an output voltage which varies randomly with time, comprising the steps of:
    generating a first oscillator signal;
    generating a second oscillator signal, wherein the frequency of the second oscillator signal is different from the frequency of the first oscillator signal, and neither signal has a frequency which is an integral multiple of the other;
    averaging the first voltage signal and the second voltage signal;
    sampling the averaged voltage;
    holding the sampled voltage to be used as a reference voltage;
    generating a third oscillator signal, wherein the frequency of the third oscillator signal is proportional to the reference voltage;
    generating a gating signal which has the same frequency and phase as the third generated signal, and which causes said sampling step to take place; and
    summing the second oscillator signal and the third oscillator signal, wherein the output of the summing step is proportional to the sum of the second oscillator signal and the third oscillator signal.

9. The method of claim 8, for providing a variable power output to a load, further comprising the step of supplying power to the load in proportion to the output voltage from said summing step.

10. An apparatus for providing a randomly varying voltage, which comprises:
    a first periodic voltage source;
    a second periodic voltage source;
    an averager coupled to the output of said first periodic source and to the output of said second periodic source, for providing an output proportional to the sum of the outputs of said first periodic source and said second periodic source;

a gate coupled to the averager output, for sampling the instantaneous averager output voltage;

a hold unit coupled to said gate, for providing a reference voltage proportional to the sampled averager output voltage;

a variable frequency periodic voltage source coupled to said hold unit, wherein the frequency is determined by the reference voltage, and also coupled to said gate, so that the gate samples the averager output at a fixed point of each output cycle; and, a summer with inputs coupled to the output of said variable frequency periodic source and to the output of said second periodic source, for providing an output voltage proportional to the sum of the inputs.

11. The apparatus of claim 10, wherein:

the first periodic source output is a sawtooth wave;

the second periodic source output is a triangular wave; and the variable frequency source output is a triangular wave.

12. The apparatus of claim 10, for providing variable power to a load, which further comprises:

a triac connected in series with the power supply to the load; and means coupled to the output of said summer for controlling the conduction angle of said triac, so that the conduction angle is proportional to the output of said summer.

13. An apparatus for providing a periodic output of randomly varying frequency, which comprises:

a first periodic source;

a second periodic source;

an averager having inputs coupled to the outputs of said first periodic source and said second periodic source, and having an output proportional to the sum of the inputs;

a gate coupled to the output of said averager for sampling the averager output;

a hold unit coupled to said gate for providing a reference voltage proportional to the sampled averager output;

a voltage controlled oscillator coupled to said hold unit wherein the output frequency is proportional to the reference voltage; and means coupled between said voltage controlled oscillator and said gate for controlling said gate so that the averager output is sampled once for each output cycle of the voltage controlled oscillator.

14. The apparatus of claim 13 wherein:

the first periodic source is a sawtooth wave generator;

the second periodic source is a triangular wave generator; and the voltage controlled oscillator output is a triangular wave.

* * * * *